United States Patent
Kitagawa et al.

(10) Patent No.: US 12,063,869 B2
(45) Date of Patent: Aug. 13, 2024

(54) MAGNETIC MEMORY DEVICE

(71) Applicant: Kioxia Corporation, Tokyo (JP)

(72) Inventors: Eiji Kitagawa, Seoul (KR); Youngmin Eeh, Seongnam-si Gyeonggi-do (KR); Tadaaki Oikawa, Seoul (KR); Kazuya Sawada, Seoul (KR); Taiga Isoda, Seoul (KR)

(73) Assignee: Kioxia Corporation, Tokyo (JP)

( * ) Notice: Subject to any disclaimer, the term of this patent is extended or adjusted under 35 U.S.C. 154(b) by 399 days.

(21) Appl. No.: 17/472,131

(22) Filed: Sep. 10, 2021

(65) Prior Publication Data
US 2022/0093848 A1 Mar. 24, 2022

(30) Foreign Application Priority Data

Sep. 18, 2020 (JP) .................................. 2020-157517

(51) Int. Cl.
| | |
|---|---|
| *H10N 50/80* | (2023.01) |
| *G11C 11/16* | (2006.01) |
| *H10B 61/00* | (2023.01) |
| *H10N 50/10* | (2023.01) |
| *H10N 50/85* | (2023.01) |

(52) U.S. Cl.
CPC .............. *H10N 50/80* (2023.02); *G11C 11/16* (2013.01); *H10B 61/10* (2023.02); *H10N 50/10* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 8,995,181 B2 | 3/2015 | Watanabe et al. | |
| 9,130,143 B2 | 9/2015 | Nagase et al. | |
| 9,142,756 B2 | 9/2015 | Nagamine et al. | |
| 9,178,137 B2 | 11/2015 | Eeh et al. | |

(Continued)

FOREIGN PATENT DOCUMENTS

| | | |
|---|---|---|
| JP | 2018157161 A | 10/2018 |
| JP | 2019057636 A | 4/2019 |
| JP | 2020035975 A | 3/2020 |

OTHER PUBLICATIONS

U.S. Appl. No. 17/199,593, First Named Inventor: Kenichi Yoshino; Title: "Magnetic Memory Device and Method for Manufacturing the Same"; filed: Mar. 12, 2021.

(Continued)

*Primary Examiner* — Kevin M Bernatz
(74) *Attorney, Agent, or Firm* — Holtz, Holtz & Volek PC

(57) ABSTRACT

According to one embodiment, a magnetic memory device includes a first magnetic layer, a second magnetic layer and a third magnetic layer having a fixed magnetization direction antiparallel to a magnetization direction of the second magnetic layer, first, second and third nonmagnetic layers. The firs nonmagnetic layer is between the first and second magnetic layers, the second magnetic layer is between the first nonmagnetic layer and the third magnetic layer, the third magnetic layer is between the second magnetic layer and the second nonmagnetic layer, the third nonmagnetic layer is between the second and the third magnetic layers, the third magnetic layer contains Co and Pt, and the second nonmagnetic layer contains at least one of Mo and W.

23 Claims, 6 Drawing Sheets

(56) References Cited

U.S. PATENT DOCUMENTS

| | | |
|---|---|---|
| 9,184,374 B2 | 11/2015 | Sawada et al. |
| 9,209,386 B2 | 12/2015 | Nagamine et al. |
| 9,252,357 B2 | 2/2016 | Watanabe et al. |
| 9,269,890 B2 | 2/2016 | Nakayama et al. |
| 9,293,695 B2 | 3/2016 | Ueda et al. |
| 9,461,240 B2 | 10/2016 | Sawada et al. |
| 9,466,350 B2 | 10/2016 | Murayama et al. |
| 9,608,199 B1 | 3/2017 | Kitagawa |
| 9,620,561 B2 | 4/2017 | Nagase et al. |
| 9,640,584 B2 | 5/2017 | Nagamine et al. |
| 9,647,203 B2 | 5/2017 | Kitagawa et al. |
| 9,705,076 B2 | 7/2017 | Nagamine et al. |
| 9,741,928 B2 | 8/2017 | Ueda et al. |
| 9,947,862 B2 | 4/2018 | Watanabe et al. |
| 9,991,313 B2 | 6/2018 | Watanabe et al. |
| 10,026,888 B2 | 7/2018 | Ochiai et al. |
| 10,026,891 B2 | 7/2018 | Nagase et al. |
| 10,090,459 B2 | 10/2018 | Watanabe et al. |
| 10,103,318 B2 | 10/2018 | Watanabe et al. |
| 10,170,519 B2 | 1/2019 | Eeh et al. |
| 10,199,568 B2 | 2/2019 | Nagamine et al. |
| 10,211,256 B2 | 2/2019 | Kitagawa |
| 10,263,178 B2 | 4/2019 | Sawada et al. |
| 10,325,640 B2 | 6/2019 | Kishi et al. |
| 10,388,343 B2 | 8/2019 | Oikawa et al. |
| 10,468,170 B2 | 11/2019 | Eeh et al. |
| 10,510,950 B2 | 12/2019 | Watanabe et al. |
| 10,573,805 B2 | 2/2020 | Murayama et al. |
| 10,622,545 B2 | 4/2020 | Toko et al. |
| 10,840,434 B2 | 11/2020 | Kitagawa et al. |
| 10,873,021 B2 | 12/2020 | Eeh et al. |
| 10,910,032 B2 | 2/2021 | Kishi et al. |
| 11,127,445 B2 | 9/2021 | Eeh et al. |
| 2009/0080238 A1* | 3/2009 | Yoshikawa ............ H10N 50/10 365/158 |
| 2012/0069642 A1* | 3/2012 | Ueda ...................... H10N 50/10 365/158 |
| 2013/0010532 A1* | 1/2013 | Nagase ............... H01F 10/3272 365/158 |
| 2014/0119109 A1* | 5/2014 | Nagase ................. G11C 11/161 365/158 |
| 2014/0284534 A1 | 9/2014 | Nagase et al. |
| 2014/0284539 A1* | 9/2014 | Eeh ....................... H10N 50/01 257/4 |
| 2014/0284733 A1* | 9/2014 | Watanabe ............ H01F 1/0306 257/421 |
| 2015/0068887 A1 | 3/2015 | Nagamine et al. |
| 2015/0069544 A1 | 3/2015 | Nagamine et al. |
| 2015/0069554 A1 | 3/2015 | Nakayama et al. |
| 2015/0249203 A1* | 9/2015 | Yoon ...................... G06F 12/08 257/421 |
| 2015/0259788 A1 | 9/2015 | Nagamine et al. |
| 2016/0099408 A1 | 4/2016 | Nagamine et al. |
| 2016/0130693 A1 | 5/2016 | Sawada et al. |
| 2016/0260773 A1 | 9/2016 | Kitagawa et al. |
| 2016/0268501 A1 | 9/2016 | Kitagawa |
| 2017/0263678 A1 | 9/2017 | Kitagawa |
| 2017/0263679 A1 | 9/2017 | Ozeki et al. |
| 2017/0263680 A1 | 9/2017 | Yoshino et al. |
| 2017/0263857 A1* | 9/2017 | Watanabe ............. G11C 11/161 |
| 2018/0076262 A1 | 3/2018 | Eeh et al. |
| 2018/0166627 A1* | 6/2018 | Kim ........................ H01F 41/18 |
| 2018/0205006 A1 | 7/2018 | Watanabe et al. |
| 2018/0269043 A1 | 9/2018 | Ueda et al. |
| 2018/0277745 A1 | 9/2018 | Oikawa et al. |
| 2018/0309048 A1 | 10/2018 | Ochiai et al. |
| 2019/0019841 A1 | 1/2019 | Eeh et al. |
| 2019/0080739 A1* | 3/2019 | Oikawa .................. H10B 61/22 |
| 2020/0075072 A1 | 3/2020 | Nagase et al. |
| 2020/0075671 A1 | 3/2020 | Ozeki et al. |
| 2020/0294567 A1 | 9/2020 | Oikawa et al. |
| 2020/0302987 A1 | 9/2020 | Sawada et al. |
| 2021/0074908 A1 | 3/2021 | Oikawa et al. |
| 2021/0074911 A1 | 3/2021 | Soda et al. |
| 2021/0083170 A1* | 3/2021 | Sawada ............... G11C 11/1659 |
| 2021/0287728 A1 | 9/2021 | Isoda et al. |
| 2021/0287755 A1 | 9/2021 | Aikawa et al. |
| 2021/0288240 A1 | 9/2021 | Sawada et al. |
| 2022/0302205 A1* | 9/2022 | Oikawa .................. H10N 50/85 |

OTHER PUBLICATIONS

U.S. Appl. No. 17/389,399, First Named Inventor: Taiga Isoda; Title: "Magnetoresistance Memory Device"; filed: Jul. 30, 2021.

U.S. Appl. No. 17/471,327, First Named Inventor: Takao Ochiai; Title: "Magnetoresistance Memory Device and Method of Manufacturing Magnetoresistance Memory Device"; filed: Sep. 10, 2021.

U.S. Appl. No. 17/471,340, First Named Inventor: Kazuya Sawada; Title: "Magnetic Memory Device"; filed: Sep. 10, 2021.

U.S. Appl. No. 17/472,056, First Named Inventor: Tadaaki Oikawa; Title: "Magnetic Memory Device"; filed: Sep. 10, 2021.

U.S. Appl. No. 17/472,472, First Named Inventor: Tadaaki Oikawa; Title: "Magnetic Memory Device"; filed: Sep. 10, 2021.

* cited by examiner

MAGNETIC MEMORY DEVICE

CROSS-REFERENCE TO RELATED APPLICATIONS

This application is based upon and claims the benefit of priority from Japanese Patent Application No. 2020-157517, filed Sep. 18, 2020, the entire contents of which are incorporated herein by reference.

FIELD

Embodiments described herein relate generally to a magnetic memory device.

BACKGROUND

Nonvolatile magnetic memory devices in which magnetoresistance effect elements are integrated on a semiconductor substrate have been proposed.

DETAILED DESCRIPTION

In general, according to one embodiment, a magnetic memory device includes a stacked structure including: a first magnetic layer having a variable magnetization direction; a second magnetic layer having a fixed magnetization direction; a third magnetic layer having a fixed magnetization direction antiparallel to the magnetization direction of the second magnetic layer; a first nonmagnetic layer; a second nonmagnetic layer; and a third nonmagnetic layer, wherein the first nonmagnetic layer is provided between the first magnetic layer and the second magnetic layer, the second magnetic layer is provided between the first nonmagnetic layer and the third magnetic Layer, the third magnetic layer is provided between the second magnetic layer and the second nonmagnetic layer, the third nonmagnetic layer is provided between the second magnetic layer and the third magnetic layer, the third magnetic layer contains cobalt (Co) and platinum (Pt), and the second nonmagnetic layer contains at least one of molybdenum (Mo) and tungsten (W) and is in direct contact with the third magnetic layer.

Embodiments will be described hereinafter with reference to the accompanying drawings.

Embodiment 1

Figure 1:
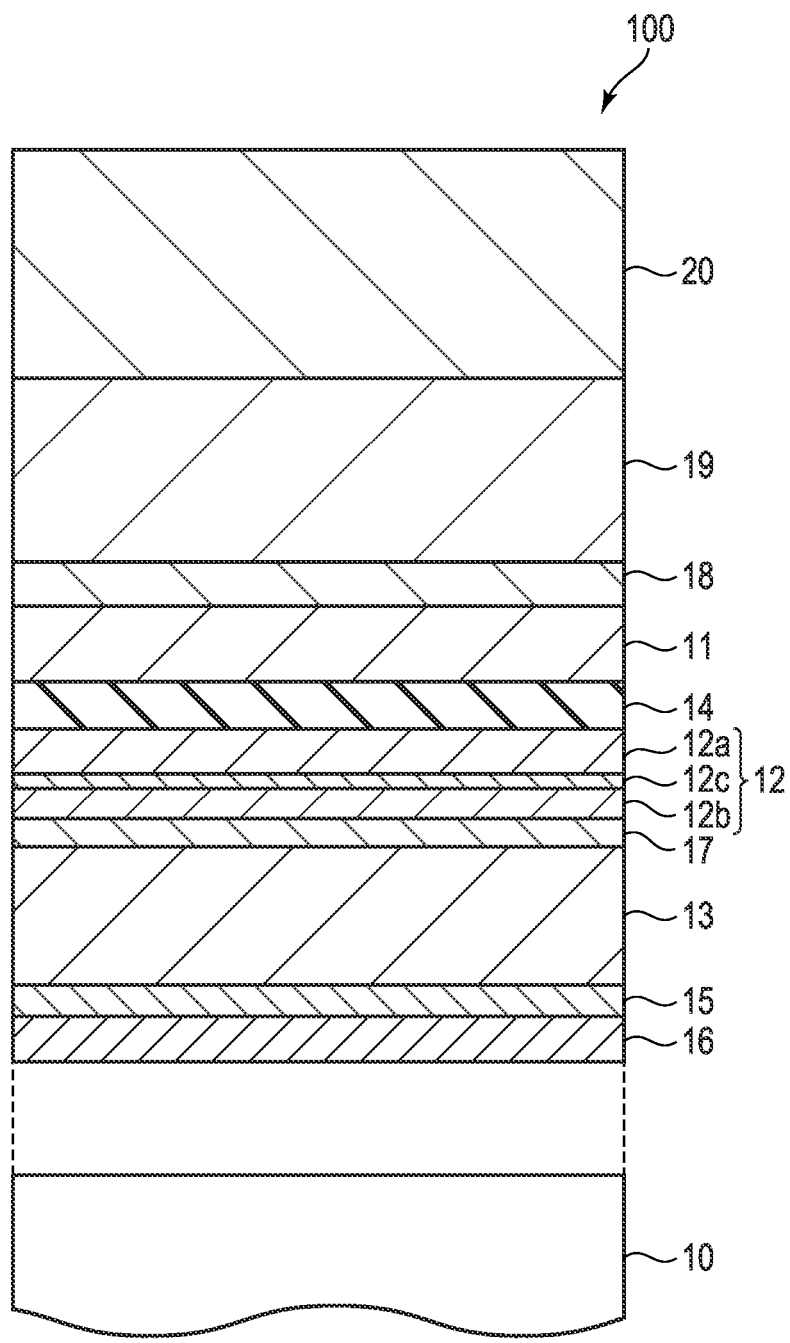
FIG. 1 is a cross-sectional view schematically illustrating an example of a configuration of a magnetic memory device according to a first embodiment.

FIG. 1 is a cross-sectional view schematically illustrating a configuration of a nonvolatile magnetic memory device according to a first embodiment. More specifically, FIG. 1 is a cross-sectional view schematically illustrating a configuration of a nonvolatile magnetoresistance effect element. Incidentally, in the present embodiment and embodiments to be described below, application of a magnetic tunnel junction (MTJ) element as a magnetoresistance effect element will be described.

A magnetoresistance effect element 100 illustrated in FIG. 1 is provided on a lower structure including a semiconductor substrate 10 and the like. That is, a plurality of magnetoresistance effect elements 100 are integrated on the semiconductor substrate 10.

The magnetoresistance effect element 100 is configured of a stacked structure including a magnetic layer (first magnetic layer) 11, a magnetic layer (second magnetic layer) 12, a magnetic layer (third magnetic layer) 13, a tunnel barrier layer (first nonmagnetic layer) 14, an upper buffer layer (second nonmagnetic layer) 15, a lower buffer layer (fourth nonmagnetic layer) 16, a spacer layer (third nonmagnetic layer) 17, a cap layer 16, an upper electrode layer 19, and a hard mask layer 20.

More specifically, the tunnel barrier layer 14 is provided between the magnetic layer 11 and the magnetic layer 12, the magnetic layer 12 is provided between the tunnel barrier layer 14 and the magnetic layer 13, the magnetic layer 13 is provided between the magnetic layer 12 and the upper buffer layer 15, the upper buffer layer 15 is provided between the magnetic layer 13 and the lower buffer layer 16, and the spacer layer 17 is provided between the magnetic layer 12 and the magnetic layer 13.

The order of stacking the above layers is the same as that illustrated in FIG. 1, and the lower buffer layer 16, the upper buffer layer 15, the magnetic layer 13, the spacer layer 17, the magnetic layer 12, the tunnel barrier layer 14, the magnetic layer 11, the cap layer 18, the upper electrode layer 19, and the hard mask layer 20 are stacked in order from the lower layer side (the lower structure side including the semiconductor substrate 10 and the like).

The magnetic layer (first magnetic layer) 11 is a ferromagnetic layer having a variable magnetization direction, and functions as a storage layer of the magnetoresistance effect element 100. Incidentally, the variable magnetization direction indicates that the magnetization direction changes to a predetermined write current. The magnetic layer 11 is formed of an FeCoB layer containing iron (re), cobalt (Co) and boron (B). The thickness of the magnetic layer 11 is approximately 1.8 nm.

The magnetic layer (second magnetic layer) 12 is a ferromagnetic layer having a fixed magnetization direction, and functions as a reference layer of the magnetoresistance effect element 100. The fixed magnetization direction indicates that the magnetization direction does not change to a predetermined write current. The magnetic layer 12 includes a first layer part 12a provided on the tunnel barrier layer 14 side (side close to the tunnel barrier layer 14), a second layer part 12b provided on the magnetic layer 13 side (side far from the tunnel barrier layer 14), and a third layer part 12c provided between the first layer part 12a and the second layer part 12b.

The first layer part 12a is formed of an FeCoB layer containing iron (Fe), cobalt (Co) arid boron (B). The thickness of the first layer, part 12a is approximately 0.8 nm.

The second layer part 12b is formed of a cobalt (Co) layer. The thickness of the second layer port 12b is approximately 0.5 nm.

The third layer part 12c is formed of a molybdenum (Mo) layer. The thickness of the third layer part 12c is approximately 0.16 nm.

The magnetic layer (third magnetic layer) 13 is a ferromagnetic layer having a fixed magnetization 0direction antiparallel to the magnetization direction of the magnetic layer 12, and functions as a shift canceling layer of the magnetoresistance effect element 100. That is, the magnetic layer 13 has a function of canceling a magnetic field applied from the magnetic layer 12 to the magnetic layer 11.

The magnetic layer 13 is formed of a multilayer film in which cobalt (Co) layers and platinum (Pt) layers are alternately provided in a stacking direction of the stacked structure of the magnetoresistance effect element 100. That is, the magnetic layer 13 has a supperlattice structure in which Co layers and Pt layers are stacked alternately.

Figure 2:
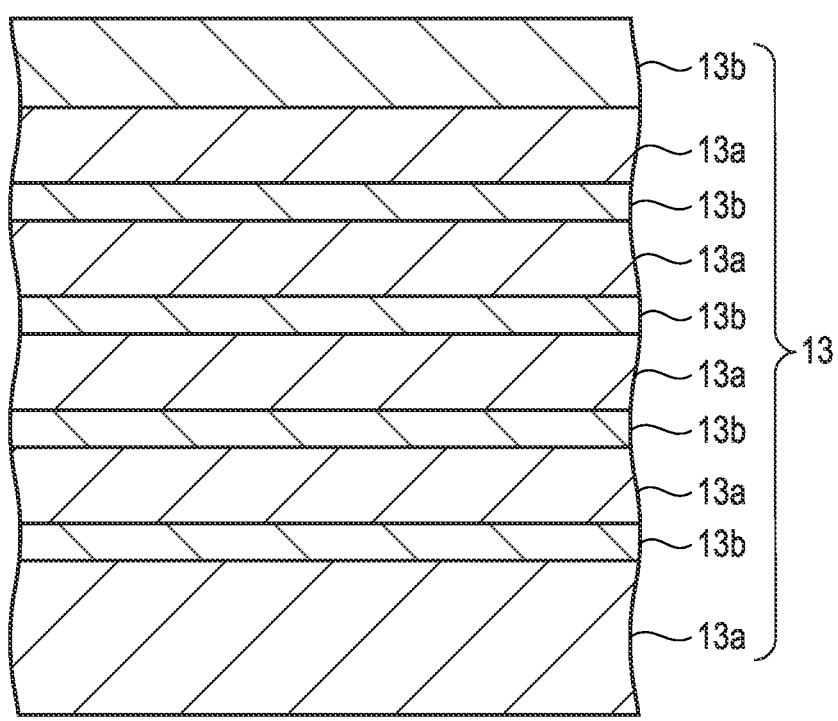
FIG. 2 is a cross-sectional view schematically illustrating an example of a configuration of a third magnetic layer included in a magnetoresistance effect element of the magnetic memory device according to the first embodiment.
Figure 3:
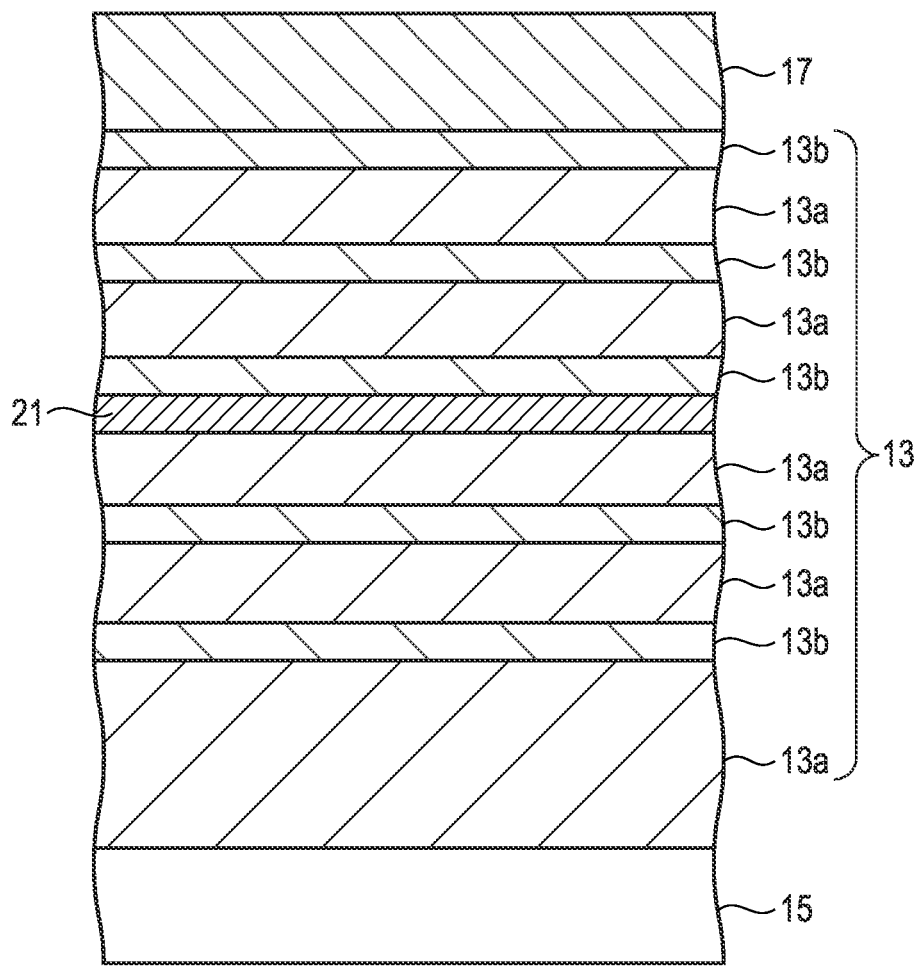
FIG. 3 is a cross-sectional view schematically illustrating an example of a configuration of a third magnetic layer included in a magnetoresistance effect, element of the magnetic memory device according to a second embodiment.

FIG. 2 is a cross-sectional view schematically illustrating the structure of the magnetic layer 13. In the example illustrated in FIG. 2, the magnetic layer 13 has a structure in which five Pt layers 13a and five Co layers 13b are stacked alternately. The thickness of each Pt layer 13a and each Co layer 13b is less than 1 nm. For example, the magnetic layer 13 has a structure in which the Pt layer (0.5 nm), the Co layer (0.4 nm), the Pt layer (0.15 nm), the Co layer (0.4 nm), the Pt layer (0.15 nm), the Co layer (0.4 nm), the Pt layer (0.15 nm), the Co layer (0.4 nm), the Pt layer (0.15 nm), and the Co layer (0.7 nm) are stacked sequentially from the lower layer side towards the upper layer side, and a total thickness is 3.4 nm.

The Co layers can be incorporated 1.2 times or more at a ratio of film thickness to the Pt layers, and the film can be thinned, by using such a structure.

In addition, the magnetic layer 13 has a hexagonal close-packed (HCP) structure, and a (0001) surface of the HCP structure is oriented in a vertical direction to the film surface of the stacked structure of the magnetoresistance effect element 100. That is, lower and upper surfaces of the magnetic layer 13 are (0001) surfaces.

The tunnel barrier layer (first nonmagnetic layer) 14 is an insulating layer and is formed of an MgO layer containing magnesium (Mg) and oxygen (O). The thickness of the tunnel barrier layer 14 is approximately 1.0 nm.

The upper buffer layer (second nonmagnetic layer) 15 is formed of a molybdenum (Mo) layer. The upper buffer layer 15 has a body centered cubic (BCC) crystalline structure, and a (110) surface of the BCC crystalline structure is oriented in the vertical direction to a film surface of the stacked structure. That is, lower and upper surfaces of the upper buffer layer 15 are (110) surfaces. The upper buffer layer 15 functions as a crystal orientation nucleus for improving the crystallinity of the magnetic layer 13. The thickness of the upper buffer layer 15 is approximately 0.5 nm.

Incidentally, the magnetic layer 13 has the HCP crystalline structure oi a face centered cubic (FCC) crystalline structure. An averaged lattice space of the HCP crystalline structure or: the FCC crystalline structure is referred to as d1. More specifically, an average of the interatomic distance to configure the magnetic layer 13 in the direction parallel to the film surface of the magnetic layer 13 is referred to as an averaged lattice space d1. The upper buffer layer 15 has the BCC crystalline structure. The averaged lattice space of the BCC crystalline structure Is referred to as d2. An average of the interatomic distance to construct the upper buffer layer 15 in the direction parallel to the film surface of the upper buffer layer 15 is referred to as an averaged lattice space d2. d1 and d2 desirably satisfy following relationship:

$$0.95 < d2/d1 < 1.0.$$

The above relationship is also desirably satisfied at at least an interface between the magnetic layer 13 and the upper buffer layer 15.

The lower buffer layer (fourth nonmagnetic layer) 16 has an amorphous structure, but does not have a particular crystalline structure. For example, the lower buffer layer 16 is formed of a layer containing hafnium (Hf). This lower buffer layer 16 has a function of enhancing flatness of the layer formed on the lower buffer layer 16 and a function of Initializing a crystallization property of the upper buffer layer 15 formed on the lower buffer layer 16. The initialization means forming a specific orientation surface in the direction parallel to a film surface of the upper buffer layer 15. That is, crystal nucleus is formed by forming the upper buffer layer 15 on the above-mentioned lower buffer layer 16. The thickness of the lower buffer layer 16 is approximately 1.0 nm. Incidentally, a bottom electrode (not illustrated) of the magnetoresistance effect element 100 is connected to the lower buffer layer 16.

The spacer layer (third nonmagnetic layer) 17 is formed of metallic materials such as iridium (Ir) and ruthenium (Ru) and functions as a synthetic antiferromagnetic coupling (SyAFC) layer to form antiferromagnetic coupling of the magnetic layer 12 and the magnetic layer 13. The thickness of the spacer layer 17 is approximately 0.5 nm.

The cap layer 15 is provided on the magnetic layer 11 and is formed of a base metal oxide layer, a rare-earth oxide layer or an alkaline-earth metal oxide layer. The thickness of the cap layer 18 is approximately 1.0 nm.

The upper electrode layer 19 is provided on the cap layer 16 and functions as a top electrode of the magnetoresistance effect element 100. The upper electrode layer 19 is formed of a single Layer containing metallic materials such as hafnium (Hf), tantalum (Ta), tungsten (W), zirconium (Zr), niobium (Nb), and molybdenum (Mo) or layers obtained by stacking a plurality of materials. The thickness of the upper electrode layer 19 is less than 5 nm.

The hard mask layer 20 is provided on the upper electrode layer 19 and is formed of a ruthenium (Ru) layer having a thickness of less than 10 nm.

The above-described magnetoresistance effect element 100 is a spin transfer torque (STT) type magnetoresistance effect element having perpendicular magnetization. That is, each of the magnetization directions of the magnetic layer 11, the magnetic layer 12 and the magnetic layer 13 is the direction perpendicular to the film surface.

The magnetoresistance effect element 100 is in a relatively low resistive state when the magnetization direction of the magnetic layer 11 is parallel to the magnetization direction of the magnetic layer 12, and is in a relatively high resistive state when the magnetization direction of the magnetic layer 11 is antiparallel to the magnetization direction of the magnetic layer 12. Therefore, the magnetoresistance effect element 100 can store binary data in accordance with the resistance state (low resistance state or high resistance state) of the magnetoresistance effect element 100. In addition, the resistance state (low resistive state or high resistive state) can be set in accordance with the direction of the current flowing to the magnetoresistance effect element 100, in the magnetoresistance effect element 100.

As described above, the upper buffer layer 15 is formed of a molybdenum (Mo) layer having the BCC crystalline structure aligned to the (110) surface, in the magnetoresistance effect element 100 of the embodiments. An excellent magnetoresistance effect element 100 can be obtained by using such an upper buffer layer 15.

In general, when the magnetic layer (shift canceling layer) 13 is formed of a Co/Pt multilayer film aligned to an HCP (0001) surface or an FCC (111) surface, a layer aligned to the FCC (111) surface or the HCP (0001) surface is used as an uppermost layer of the buffer layer that functions as the crystal orientation nucleus.

In contrast, it has been clarified that when the Mo layer aligned to a BCC (110) surface is used as the upper buffer layer 15, a desirably aligned Co/Pt multilayer film can be obtained to the HCP (0001) surface or the FCC (111) surface, as in the embodiments. The excellent magnetoresistance effect element 100 can be obtained as described below by using the Mo layer aligned to such a BCC (110) surface as the upper buffer layer 15.

In general, a thick platinum (Pt) layer, ruthenium (Ru) layer, or iridium (Ir) layer having a thickness of 1 nm or more is usually used as the uppermost layer of the buffer layer. These materials are easy to diffuse to the first layer part (FeCoB layer) 12a of the magnetic layer (reference layer) 12, and becomes a factor to reduce the MR ratio of the magnetoresistance effect element.

In the embodiments, interdiffusion between the upper buffer layer (Mo layer) 15 and the first layer part (FeCoB layer) 12a of the magnetic layer 12 can be inhibited and the reduction of the MR ratio can be inhibited by using the Mo layer aligned to the BCC (110) surface as the upper buffer layer 15.

In addition, in the embodiments, since the Co/Pt multilayer film (magnetic layer 13) desirably aligned to the HCP (0001) surface or the FCC (111) surface can be obtained by using the Mo layer aligned to the BCC (110) surface for the upper buffer layer 15, the crystalline property of the Co/Pt multilayer film can be improved and the perpendicular magnetic anisotropy of the Co/Pt multilayer film cart be improved. Furthermore, the antiferromagnetic coupling between the magnetic layer 12 and the magnetic layer 13 via the spacer layer (Ir layer) 17 can be enhanced.

In addition, in the embodiments, the thickness of the magnetoresistance effect element 100 including the buffer layer (upper buffer layer 15 and lower buffer layer 16) can be decreased by using the Mo layer aligned to the BCC (110) surface. For this reason, an interval between adjacent magnetoresistance effect elements 100 can be narrowed and a highly integrated magnetic memory device can be obtained as described below.

In general, when the magnetic layer (shift canceling layer) 13 is formed of the Co/Pt multilayer film aligned to the HCP (0001) surface or the FCC (111) surface, an ion beam is applied to the stacked structure from the oblique direction to inhibit the redeposition on a side wall of the staked structure by the etched materials. However, when the height of the stacked structure is large (i.e., when the thickness of the whole layer constructing the stacked structure is large), a lower part of the stacked structure is shielded from an ion beam by the adjacent stacked structure and there is a risk that etching cannot be executed certainly. Therefore, an interval between the adjacent magnetoresistance effect elements needs to be widened to inhibit redeposition of the etched materials and to etch the lower part of the stacked structure certainly. For this reason, a problem arises that high integration of the magnetoresistance effect elements is limited.

In the present embodiment, since the stacked structure can be lowered (i.e., since the whole layer constructing the stacked structure can be thinned), an interval between adjacent magnetoresistance effect elements can be narrowed, and high integration of the magnetoresistance effect elements can be achieved.

In addition, as described above, the magnetic layer 13 has the HCP crystalline structure or the FCC crystalline structure. An averaged lattice space of the HCP crystalline structure or the FCC crystalline structure is referred to as d1. An average of the interatomic distance to construct the magnetic layer 13 in the direction parallel to the film surface of the magnetic layer 13 is referred to as an averaged lattice space d1. An averaged lattice space of the BCC crystalline structure of the upper buffer layer 15 is referred to as d2. An average of the interatomic distance to construct the upper buffer layer 15 in the direction parallel to the film surface of the upper buffer layer 15 is referred to as an averaged lattice space d2.

In this case, d1 and d2 desirably satisfy the following relationship:

$$0.95 < d2/d1 < 1.0.$$

When such a relationship is satisfied, a misfit between the lattice of the FCC crystalline structure of the magnetic layer 13 and the lattice of the BCC crystalline structure of the upper buffer layer 15 can be inhibited, and crystallization can be promoted effectively.

Incidentally, in the above-described embodiment, a molybdenum (Mo) layer is used as the upper buffer layer 15, but a tungsten (W) layer may be used as the upper buffer layer 15. Alternatively, an alloy layer of Mo and W (MoW alloy layer) may be used as the upper buffer layer 15. Alternatively, alloy layers (MoPt, WPt, MoIr, WIr, MoRu, and WRu alloy layers) formed of combinations of molybdenum (Mo) and tungsten (W) with platinum (Pt), ruthenium (Ru) and iridium (Ir) may be used. That is, a layer which contains at least, one of molybdenum (Mo) and tungsten (W) and which has the BCC crystalline structure having the (110) surface perpendicular to the stacking direction of the stacked structure of the magnetoresistance effect element 100 can be used as the upper buffer layer 15.

Alternatively, in the above embodiment, a molybdenum (Mo) layer is used as the third layer part 12c of the second magnetic layer 12, but a tungsten (W) layer may be used as the third layer part 12c. Alternatively, an alloy layer of Mo and W (MoW alloy layer) may be used as the third layer part 12c. That is, a layer which contains at least one of molybdenum (Mo) and the tungsten (W) and which has the BCC crystalline structure having (110) surface in the direction perpendicular to the stacking direction of the stacked structure can be used as the third layer part 12c. Alternatively, alloy layers (MoPt, WPt, MoIr, WIr, MoRu, and WRu alloy layers) formed of combinations of molybdenum (Mo) and tungsten (W) with platinum (Pt), ruthenium (Ru) and iridium (Ir) may be used for the purpose of adjusting the averaged lattice space.

Embodiment 2

Next, a second embodiment will be described. Since basic elements are the same as those of the first embodiment, and the descriptions of the elements described in the first embodiment will be omitted.

Figure 4:
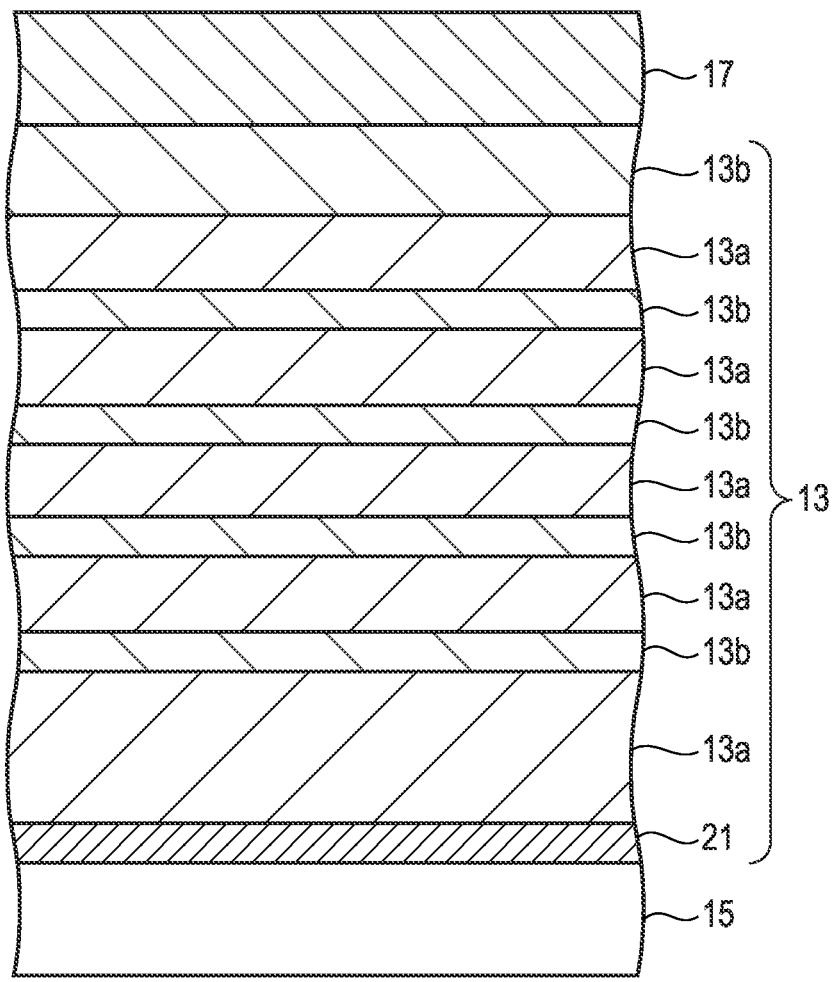
FIG. 4 is a cross-sectional view schematically illustrating another example of the configuration of the third magnetic layer included in the magnetoresistance effect element of the magnetic memory device according to the second embodiment.

FIG. 4 is a cross-sectional view schematically illustrating a configuration of a magnetic layer (third magnetic layer) 13 included in a magnetoresistance effect element 100 of the magnetic memory device according to the present embodiment. The basic configuration except the magnetic layer 13 is the same as the configuration of the first embodiment.

In the present embodiment, an SiB layer 21 containing silicon (Si) and boron (B) is provided in the magnetic layer 13. More specifically, similarly to the first embodiment, the magnetic layer 13 has a structure in which a Pt layer 13a and a Co layer 13b are alternately stacked, and the SiB layer 21 is provided between the Pt layer 13a and the Co layer 13b. The thickness of the SiB layer 21 is desirably 0.5 nm or less (for example, approximately 0.3 nm).

Figure 5:
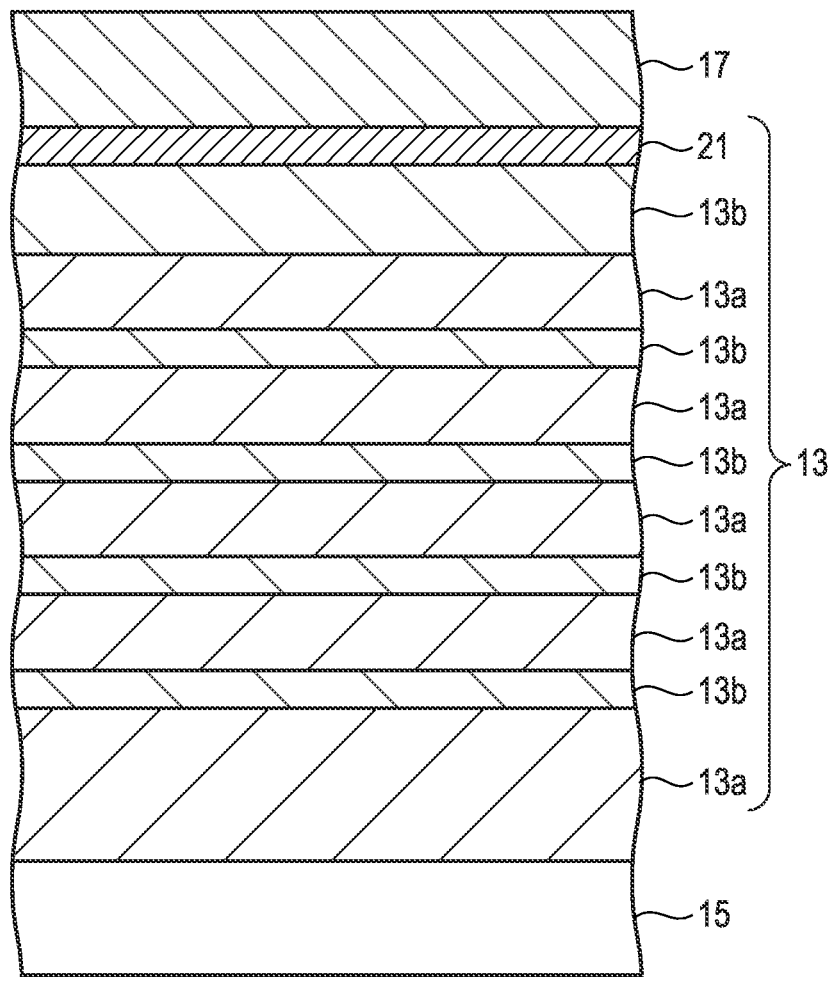
FIG. 5 is a cross-sectional view schematically illustrating the other example of the configuration of the third magnetic layer included in the magnetoresistance effect element, of the magnetic memory device according to the second embodiment.

Incidentally, the SiB layer 21 containing silicon (Si) and boron (B) is a layer configuring the magnetic layer 13, and may be provided at a surface (lower surface or upper surface) of the magnetic layer 13. That is, as illustrated in FIG. 4, the SiB layer 21 may be provided between the magnetic layer 13 and the upper buffer layer 15, and may be provided between the magnetic layer 13 and a spacer layer 17 as illustrated in FIG. 5.

Alternatively, two or more SiB layers 21 may be provided. That is, two or more SiB layers 21 may be provided in the magnetic layer 13. Alternatively, the SiB layers 21 may be provided at both the lower surface and the upper surface of the magnetic layer 13. Furthermore, one or more SiB layers 21 may be provided in the magnetic layer 13, and the SiB layer 21 may be provided at at least one of the lower surface and the upper surface of the magnetic layer 13.

Thus, in the present embodiment, the perpendicular magnetic anisotropy of the Co/Pt multilayer film, and the like can be improved by providing the SiB layer 21 in the magnetic layer 13 or at the surface of the magnetic layer 13. Diffusion of CoPt caused by heat treatment can be inhibited and degradation of the perpendicular magnetic anisotropy and the like is inhibited by providing the SiB layer 21. In particular, diffusion of Pt from the magnetic layer 13 to the other layers (magnetic layer 11, magnetic layer 12, tunnel barrier layer 14, spacer layer 17 and the like) can be inhibited and degradation of the perpendicular magnetic anisotropy and the like is inhibited. Furthermore, the antiferromagnetic coupling between the magnetic layer 12 and the magnetic layer 13 via the spacer layer (Ir layer) 17 can be improved.

Embodiment 3

Next, a third embodiment will be described. Since basic elements are the same as those of the first embodiment, and the descriptions of the elements described in the first embodiment will, be omitted.

Figure 6:
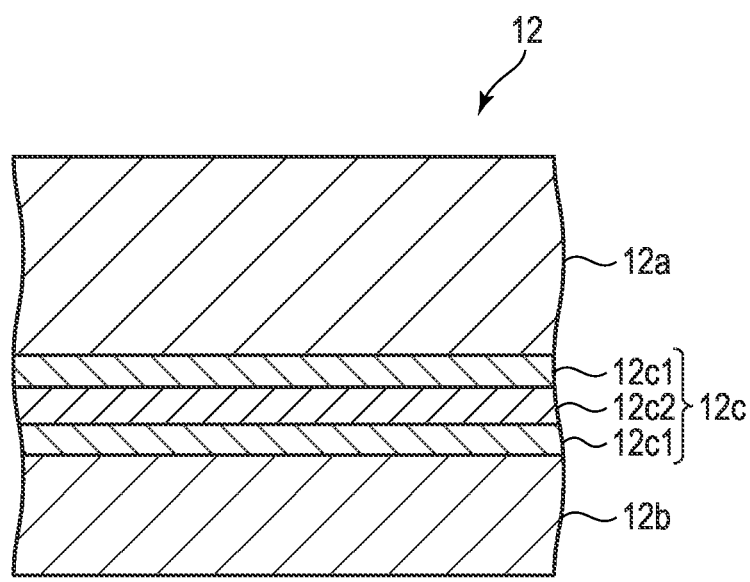
FIG. 6 is a cross-sectional view schematically illustrating an example of a configuration of a second magnetic layer included in a magnetoresistance effect element of a magnetic memory device according to a third embodiment.

FIG. 6 is a cross-sectional view schematically illustrating a configuration of a magnetic layer (second magnetic layer) 12 included in a magnetoresistance effect element 100 of the magnetic memory device according to the present embodiment. The basic configuration except the magnetic layer 12 is the same as the configuration of the first embodiment.

In the present embodiment, a third layer part 12c of the magnetic layer 12 includes first sub-layers 12c1, and a second sub-layer 12c2 which is provided between the first sub-layers 12c1 adjacent in a stacking direction of the stacked structure of the magnetoresistance effect element 100.

Each of the first sub-layers 12c1 is formed of a molybdenum (Mo) layer. In addition, each first sub-layer 12c1 has the BCC crystalline structure, and a (110) surface of the BCC crystalline structure is perpendicular to the stacking direction of the stacked structure. The second sub-layer 12c2 is formed of a cobalt (Co) layer.

More specifically, the magnetic layer 12 is formed of a first layer part 12a (FeCoB layer having a thickness of 0.8 nm), a second layer part 12b (Co layer having a thickness of 0.4 nm), a first sub-layer 12c1 of a lower layer side (Mo layer having a thickness of 0.08 nm), a first sub-layer 12c1 of an upper layer side (Mo layer having a thickness of 0.08 nm), and a second sub-layer 12c2 (Co layer having a thickness of 0.10 nm).

Incidentally, the second layer part 12b (Co layer) has the hexagonal close-packed (HCP) crystalline structure or the FCC crystalline structure. In addition, the second sub-layer 12c2 (Co layer) has the HCP crystalline structure or the BCC crystalline structure.

Thus, in the present embodiment, the second layer part 12c of the magnetic layer 12 has a structure in which the second sub-layer 12c2 (Co layer) is intervened between the first sub-layers 12c1 (Mo layers). In this structure, the antiferromagnetic coupling between the magnetic layer 12 and the magnetic layer 13 can be improved and the MR ratio of the magnetoresistance effect element 100 can also be enhanced.

In the above-described embodiment, the third layer part 12c of the magnetic layer 12 is composed of two first sub-layers 12c1 (Mo layers) and one second sub-layer 12c2 (Co layer), but the third layer part 12c may be composed of three or more first sub-layers 12c1 and two or more second sub-layers 12c2. More specifically, three or more first sub-layers 12c1 and two or more second sub-layers 12c2 may be stacked alternately, and the lowermost layer and the uppermost layer of the third layer part 12c may be composed of the first sub-layers 12c1.

Alternatively, in the above embodiment, molybdenum (Mo) layers are used as the first sub-layers 12c1, but tungsten (W) layers may be used as the first sub-layers 12c1. Alternatively, alloy layers of Mo and W (MoW alloy layers) may be used as the first sub-layers 12c1. That is, layers which contain at least one of molybdenum (Mo) and tungsten (W) and which have the BCC crystalline structure having the (110) surface perpendicular to the stacking direction of the stacked structure of the magnetoresistance effect element 100 can be used as the first sub-layers 12c1. In this case, a layer (typically, the above-described Co layer) containing none of molybdenum (Mo) and tungsten (W) can be used as the second sub-layer 12c2.

In the above-described second and third embodiments, an order of stacking from the magnetic layer 13 to the magnetic layer 11 may be reversed.

Figure 7:
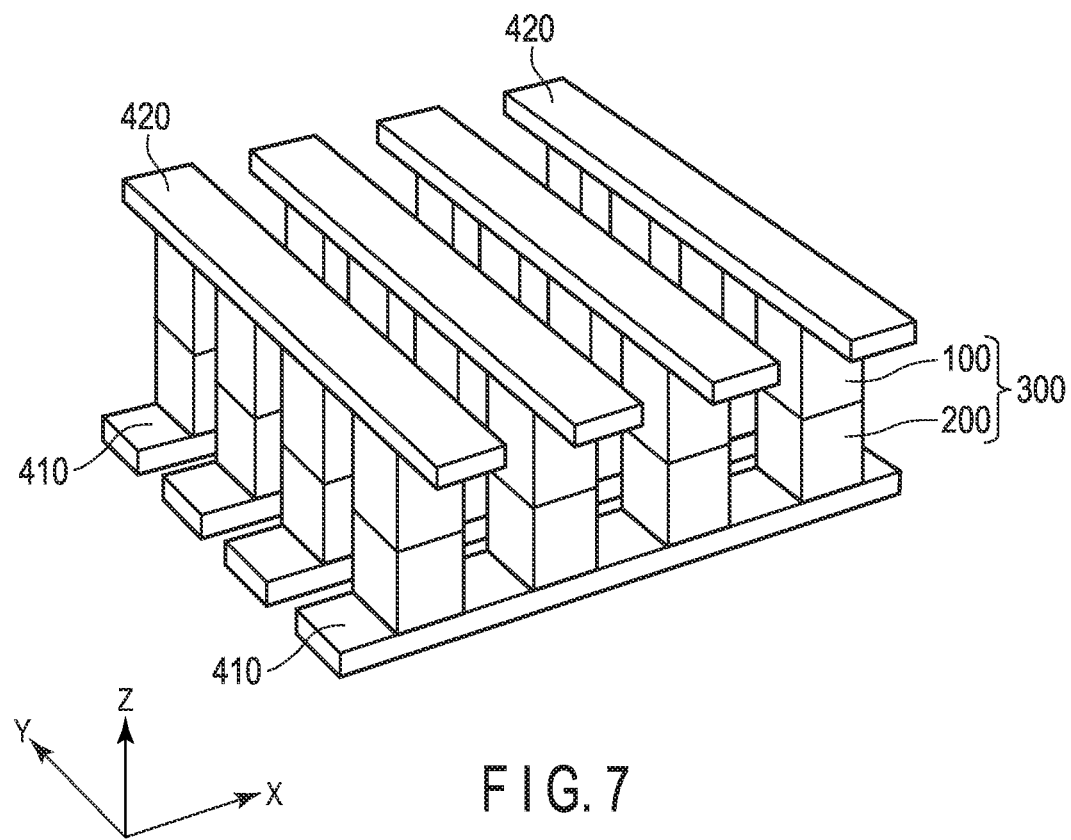
FIG. 7 is a perspective view schematically illustrating an example of a configuration of a magnetic memory device using the magnetoresistance effect element according to the first, second, and third embodiments.

FIG. 7 is a perspective view schematically illustrating an example of a configuration of a magnetic memory device using the magnetoresistance effect element 100 according to the first, second, and third embodiments.

The magnetic memory device illustrated in FIG. 7 includes a plurality of first lines 410 extending in the X direction, a plurality of second lines 420 extending in the Y direction, and a plurality of memory cells 300 connected between the first lines 410 and the second lines 420. Either of the first lines 410 and the second lines 420 correspond to word lines and the others correspond to bit lines. Each of the memory cells 300 is composed of a magnetoresistance effect element 100 and a selector (switching element) 200 connected in series with the magnetoresistance effect element 100.

The magnetoresistance effect element described in the above-described first, second, and third embodiment is used as the magnetoresistance effect element 100.

For example, a two-terminal type switching element is used as the selector 200. When the voltage applied between two terminals is lower than a threshold value, the switching element is in a high resistance state, for example, an electrically nonconductive state. When the voltage applied between two terminals is higher than or equal to the threshold value, the switching element is in a low resistance state, for example, an electrically conductive state.

A predetermined voltage is applied between the first line 410 and the second line 420 connected to a desired memory cell 300, and the selector 200 included in the desired memory ceil 300 thereby becomes an on state (conductive state), such that writing to or reading from the magnetoresistance effect element 100 included in the desired memory cell 300 can be executed.

In the example illustrated in FIG. 7, the magnetoresistance effect element 100 is located on the upper layer side and the selector 200 is located on the lower layer side, but the magnetoresistance effect element 100 may be located on the lower layer side and the selector 200 may be located on the upper layer side.

An excellent magnetic memory device can be obtained by using the magnetoresistance effect element 100 of the present embodiments as the magnetic memory device illustrated in FIG. 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure comprising:
    a first magnetic layer having a variable magnetization direction;
    a second magnetic layer having a fixed magnetization direction;
    a third magnetic layer having a fixed magnetization direction antiparallel to the magnetization direction of the second magnetic layer;
    a first nonmagnetic layer;
    a second nonmagnetic layer; and
    a third nonmagnetic layer,
    wherein:
    the first nonmagnetic layer is provided between the first magnetic layer and the second magnetic layer,
    the second magnetic layer is provided between the first nonmagnetic layer and the third magnetic layer,
    the third magnetic layer is provided between the second magnetic layer and the second nonmagnetic layer,
    the third nonmagnetic layer is provided between the second magnetic layer and the third magnetic layer,
    the third magnetic layer contains cobalt (Co) and platinum (Pt),
    the second nonmagnetic layer contains at least one of molybdenum (Mo) and tungsten (W), is provided under the third magnetic layer, and is in direct contact with the third magnetic layer,
    the third magnetic layer has an HCP crystalline structure having a (0001) surface or an FCC crystalline structure having a (111) surface, in a direction perpendicular to a stacking direction of the stacked structure, and
    the second nonmagnetic layer has a BCC crystalline structure having a (110) surface in a direction perpendicular to the stacking direction.

2. The device of claim 1, wherein the following relationship is satisfied where an averaged lattice space of the third magnetic layer is referred to as d1 and an averaged lattice space of the second nonmagnetic layer is referred to as d2:

$$0.95 < d2/d1 < 1.0.$$

3. The device of claim 1, wherein the second magnetic layer includes:
    a first layer part provided on the first nonmagnetic layer side and containing iron (Fe), cobalt (Co), and boron (B);
    a second layer part provided on the third magnetic layer side and formed of cobalt (Co);
    a third layer part provided between the first layer part and the second layer part and containing at least one of molybdenum (Mo) and tungsten (W); and
    a fourth layer part provided between the first layer part and the third layer part and formed of cobalt (Co).

4. The device of claim 1, wherein the stacked structure further comprises a layer provided in the third magnetic layer or at a surface of the third magnetic layer and containing silicon (Si) and boron (B).

5. The device of claim 1, wherein:
    the stacked structure further comprises a fourth nonmagnetic layer having an amorphous structure, and
    the fourth nonmagnetic layer is provided on a side opposite to the first nonmagnetic layer with respect to the second nonmagnetic layer.

6. The device of claim 5, wherein the fourth nonmagnetic layer is in direct contact with the second nonmagnetic layer.

7. The device of claim 1, wherein:
    the first magnetic layer contains iron (Fe), cobalt (Co), and boron (B), and
    the first nonmagnetic layer contains magnesium (Mg) and oxygen (O).

8. A magnetic memory device comprising a stacked structure comprising:
    a first magnetic layer having a variable magnetization direction;
    a second magnetic layer having a fixed magnetization direction;
    a third magnetic layer having a fixed magnetization direction antiparallel to the magnetization direction of the second magnetic layer;
    a first nonmagnetic layer;
    a second nonmagnetic layer; and
    a third nonmagnetic layer,
    wherein
    the first nonmagnetic layer is provided between the first magnetic layer and the second magnetic layer,
    the second magnetic layer is provided between the first nonmagnetic layer and the third magnetic layer,
    the third magnetic layer is provided between the second magnetic layer and the second nonmagnetic layer,
    the third nonmagnetic layer is provided between the second magnetic layer and the third magnetic layer, and the third magnetic layer includes at least one first layer containing cobalt (Co), at least one second layer containing platinum (Pt), and at least one third layer which is an SiB layer.

9. The device of claim 8, wherein the second layer is in contact with the second nonmagnetic layer.

10. The device of claim 9, wherein the third layer Is provided between the second nonmagnetic layer and the second layer.

11. The device of claim 8, wherein the first layer is in contact with the third nonmagnetic layer.

12. The device of claim 8, wherein the third layer is provided between the third nonmagnetic layer and the first layer.

13. The device of claim 8, wherein the third layer is provided between the first layer and the second layer.

14. The device of claim 8, wherein the third layer has a thickness of 0.5 nm or less.

15. The device of claim 8, wherein:
the stacked structure further comprises a fourth nonmagnetic layer having an amorphous structure, and
the fourth nonmagnetic layer is provided on a side opposite to the first nonmagnetic layer with respect to the second nonmagnetic layer.

16. The device of claim 15, wherein the fourth nonmagnetic layer is in direct contact with the second nonmagnetic layer.

17. The device of claim 8, wherein:
the first magnetic layer contains iron (Fe), cobalt (Co), and boron (B), and
the first nonmagnetic layer contains magnesium (Mg) and oxygen (O).

18. A magnetic memory device comprising a stacked structure comprising:
a first magnetic layer having a variable magnetization direction;
a second magnetic layer having a fixed magnetization direction; and
a first nonmagnetic layer provided between the first magnetic layer and the second magnetic layer,
wherein
the second magnetic layer includes:
a first layer part provided on a side close to the first nonmagnetic layer and containing iron (Fe), cobalt (Co), and boron (B);
a second layer part provided on a side far from the first nonmagnetic layer and formed of cobalt (Co); and
a third layer part provided between the first layer part and the second layer part, and
the third layer part includes:
a plurality of first sub-layers, each of the plurality of sub-layers being a molybdenum (Mo), tungsten (W), or MoW layer; and
a second sub-layer provided between the first sub-layers adjacent to each other, the second sub-layer being a cobalt (Co) layer.

19. The device of claim 18, wherein each of the first sub-layers has a BCC crystalline structure having a (110) surface in a direction perpendicular to a stacking direction of the stacked structure.

20. The device of claim 18, wherein:
the stacked structure further comprises a third magnetic layer having a fixed magnetization direction antiparallel to the magnetization direction of the second magnetic layer, a second nonmagnetic layer, and a third nonmagnetic layer,
the second magnetic layer is provided between the first nonmagnetic layer and the third magnetic layer,
the third magnetic layer is provided between the second magnetic layer and the second nonmagnetic layer, and
the third nonmagnetic layer is provided between the second magnetic layer and the third magnetic layer.

21. The device of claim 20, wherein;
the stacked structure further comprises a fourth nonmagnetic layer having an amorphous structure, and
the fourth nonmagnetic layer is provided on a side opposite to the first nonmagnetic layer with respect to the second nonmagnetic layer.

22. The device of claim 21, wherein the fourth nonmagnetic layer is in direct contact with the second nonmagnetic layer.

23. The device of claim 18, wherein:
the first magnetic layer contains iron (Fe), cobalt (Co), and boron (B), and
the first nonmagnetic layer contains magnesium (Mg) and oxygen (O).

* * * * *